(12) United States Patent
Eto et al.

(10) Patent No.: US 8,833,388 B2
(45) Date of Patent: Sep. 16, 2014

(54) PRESSURE CONTROLLING APPARATUS

(75) Inventors: Hideo Eto, Mie (JP); Makoto Saito, Mie (JP); Nobuyasu Nishiyama, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 13/416,349

(22) Filed: Mar. 9, 2012

(65) Prior Publication Data

US 2012/0227830 A1  Sep. 13, 2012

(30) Foreign Application Priority Data

Mar. 11, 2011 (JP) ................................. 2011-054691

(51) Int. Cl.
*F16K 31/02* (2006.01)
*H01L 21/67* (2006.01)
*G05D 16/20* (2006.01)

(52) U.S. Cl.
CPC ........ *H01L 21/67253* (2013.01); *G05D 16/202* (2013.01)
USPC ........ 137/487.5; 137/613; 137/614; 251/212; 251/205; 251/158; 156/345.26; 156/345.15

(58) Field of Classification Search
CPC ............... F16K 3/03; F16K 3/32; F16K 1/52; F16K 1/526; H01L 21/00
USPC ............... 251/212, 205, 206, 158; 137/487.5, 137/613, 614; 156/345.26, 345.24, 345.15
See application file for complete search history.

(56) References Cited

U.S. PATENT DOCUMENTS

| | | | | |
|---|---|---|---|---|
| 721,821 A | * | 3/1903 | Myers | 137/556 |
| 1,379,904 A | * | 5/1921 | Derby | 251/115 |
| 2,780,833 A | * | 2/1957 | Braunlich | 425/76 |
| 3,136,341 A | * | 6/1964 | Walker, Sr. et al. | 138/45 |
| 4,052,036 A | * | 10/1977 | Schertler | 251/144 |
| 4,089,505 A | * | 5/1978 | Anderle et al. | 251/129.11 |
| 4,094,492 A | * | 6/1978 | Beeman et al. | 251/212 |
| 4,333,631 A | * | 6/1982 | Bosch | 251/159 |
| 4,373,546 A | * | 2/1983 | Krakovsky | 137/330 |
| 4,513,948 A | * | 4/1985 | Konig | 251/212 |
| 5,413,139 A | * | 5/1995 | Kusumoto et al. | 137/341 |
| 5,577,707 A | * | 11/1996 | Brida | 251/159 |

(Continued)

FOREIGN PATENT DOCUMENTS

JP    2007-242668    9/2007

OTHER PUBLICATIONS

Office Action issued Apr. 30, 2013 in Japanese Patent Application No. 2011-054691 with English language translation.

*Primary Examiner* — Elizabeth Houston
*Assistant Examiner* — Minh Le
(74) *Attorney, Agent, or Firm* — Oblon, Spivak, McClelland, Maier & Neustadt, L.L.P.

(57) ABSTRACT

According to one embodiment, there is provided pressure controlling apparatus including a detecting unit, an exhaust pipe, a regulating valve, and a pressure controlling unit. The regulating valve includes a valve port, a changing unit, and a slide valve. The valve port is communicated with the exhaust pipe. The changing unit changes a shape of the valve port to a different shape whose center is located near the central axis of the exhaust pipe. The slide valve regulates an opening degree of the valve port changed by the changing unit. The pressure controlling unit controls changing of a shape of the valve port by the changing unit and regulation of an opening degree of the valve port by the slide valve.

15 Claims, 16 Drawing Sheets

(56) References Cited

U.S. PATENT DOCUMENTS

| | | | |
|---|---|---|---|
| 5,873,562 A * | 2/1999 | Marugg | 251/301 |
| 6,015,503 A * | 1/2000 | Butterbaugh et al. | 216/66 |
| 6,089,537 A * | 7/2000 | Olmsted | 251/129.11 |
| 6,510,747 B1 * | 1/2003 | Zaiser et al. | 73/861.61 |
| 6,605,176 B2 * | 8/2003 | Tzu | 156/345.26 |
| 7,004,453 B1 * | 2/2006 | Cheng | 251/211 |
| 7,090,192 B2 * | 8/2006 | Weiss | 251/301 |
| 8,122,912 B2 * | 2/2012 | Shemer et al. | 138/46 |
| 8,196,610 B2 * | 6/2012 | Murakami et al. | 138/45 |
| 8,613,607 B2 * | 12/2013 | Darsey | 417/540 |
| 2002/0117212 A1 * | 8/2002 | Vyers et al. | 137/487.5 |
| 2005/0062007 A1 * | 3/2005 | Fischer | 251/212 |
| 2005/0104024 A1 * | 5/2005 | Oliver | 251/206 |
| 2006/0261303 A1 * | 11/2006 | Thomas et al. | 251/212 |
| 2009/0152242 A1 * | 6/2009 | Sato et al. | 216/67 |
| 2012/0160344 A1 * | 6/2012 | Itafuji et al. | 137/485 |

* cited by examiner

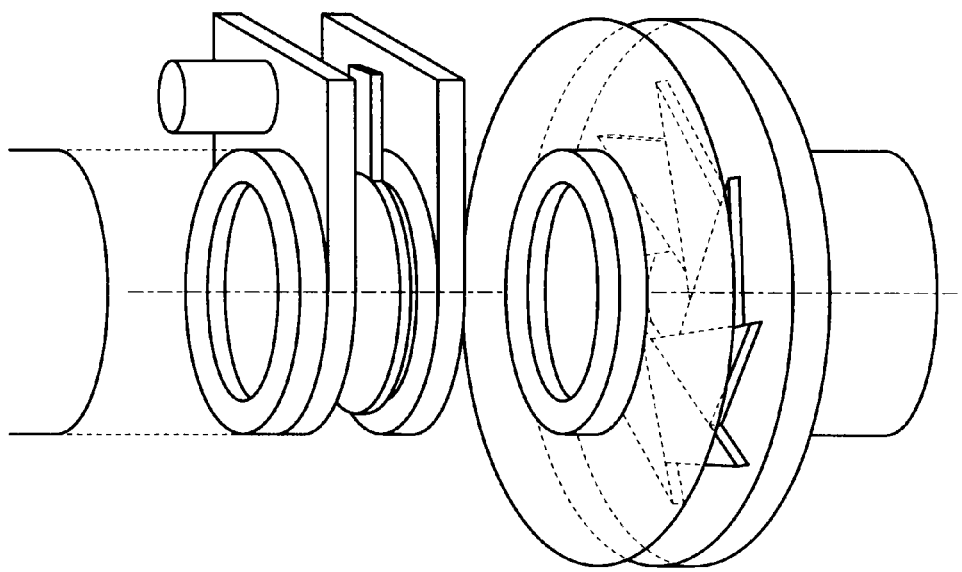
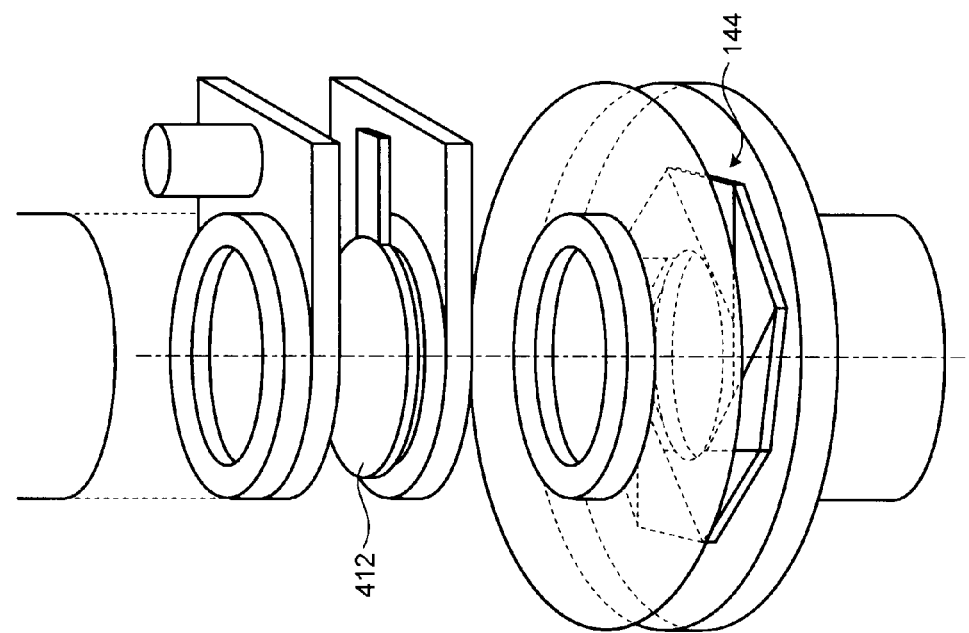

PRESSURE CONTROLLING APPARATUS

CROSS-REFERENCE TO RELATED APPLICATIONS

This application is based upon and claims the benefit of priority from Japanese Patent Application No. 2011-054691, filed on Mar. 11, 2011; the entire contents of which are incorporated herein by reference.

FIELD

Embodiments described herein relate generally to a pressure controlling apparatus.

BACKGROUND

Recently, with the progress of scaling of semiconductor devices, processing conditions in a processing technology of semiconductor devices are diversified and a processing accuracy is desired to be improved for each processing condition. Specially, in an etching technology of using a plasma processing apparatus such as a RIE (Reactive Ion Etching) apparatus, there are increasing cases where a multilayer film is collectively processed by continuous processing. In collective processing of a multilayer film, processing conditions, such as appropriate gas flow rate, pressure, temperature, and power, are sequentially changed for each layer while continuing plasma discharge. Accordingly, it is desired to accurately control pressure of a processing gas in a processing chamber when processing a semiconductor substrate for each processing condition.

BRIEF DESCRIPTION OF THE DRAWINGS

FIG. 10A and FIG. 10B are diagrams illustrating a configuration of a regulating valve in the second embodiment;

DETAILED DESCRIPTION

In general, according to one embodiment, there is provided pressure controlling apparatus that controls pressure of a processing gas in a processing chamber of a plasma processing apparatus that generates plasma from a processing gas introduced into the processing chamber and processes a processing target substrate. The pressure controlling apparatus includes a detecting unit, an exhaust pipe, a regulating valve, and a pressure controlling unit. The detecting unit detects pressure of a processing gas in the processing chamber. The exhaust pipe is communicated with the processing chamber and has a central axis passing a center of the processing chamber. The regulating valve is arranged in the exhaust pipe. The pressure controlling unit that controls the regulating valve so that pressure detected by the detecting unit matches a target value. The regulating valve includes a valve port, a changing unit, and a slide valve. The valve port is communicated with the exhaust pipe. The changing unit changes a shape of the valve port to a different shape whose center is located near the central axis of the exhaust pipe. The slide valve regulates an opening degree of the valve port changed by the changing unit. The pressure controlling unit controls changing of a shape of the valve port by the changing unit and regulation of an opening degree of the valve port by the slide valve.

Exemplary embodiments of a pressure controlling apparatus will be explained below in detail with reference to the accompanying drawings. The present invention is not limited to the following embodiments.

First Embodiment

Figure 1:
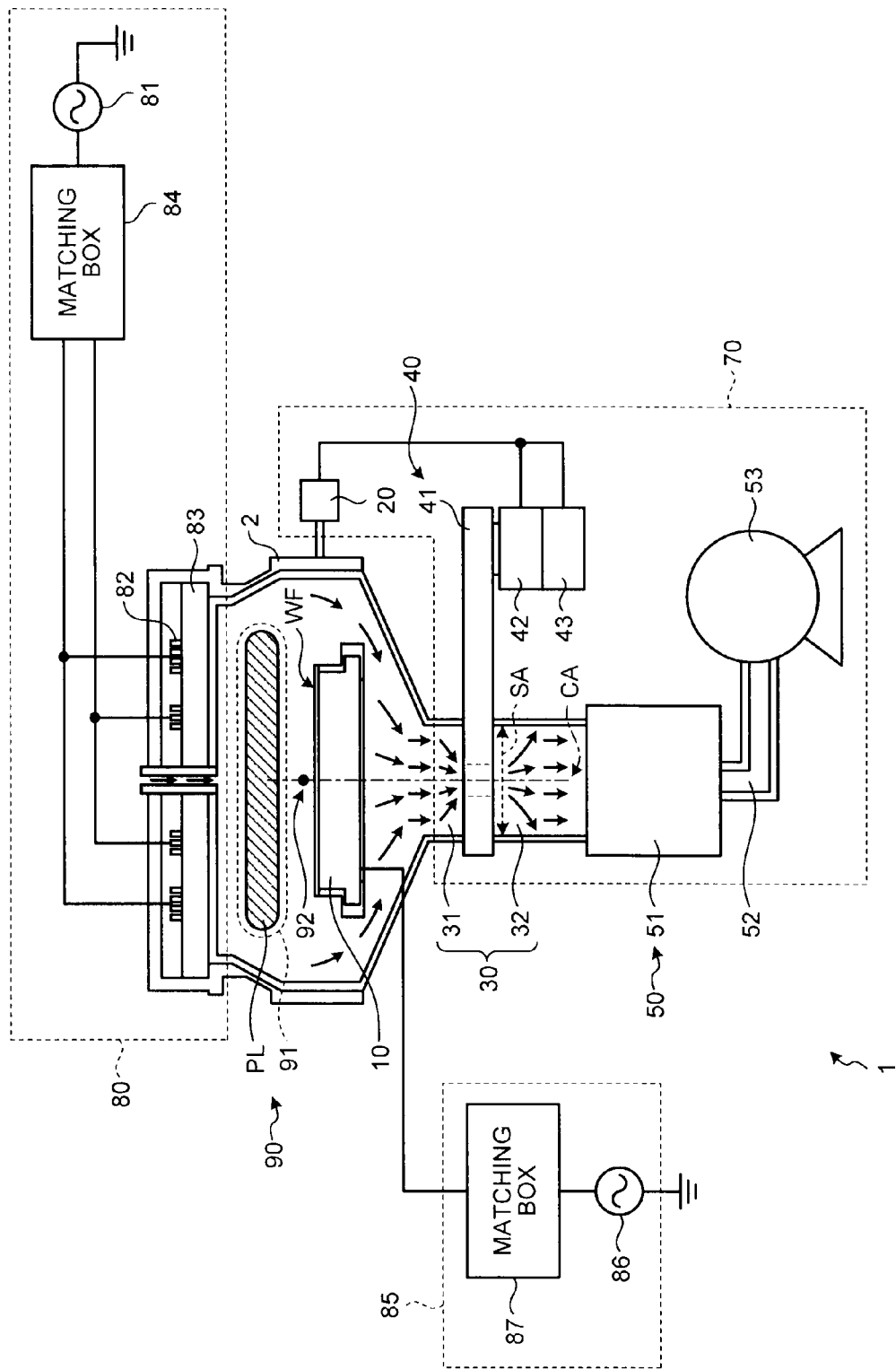
FIG. 1 is a diagram illustrating a configuration of a pressure controlling apparatus according to a first embodiment.

A plasma processing apparatus 1 to which a pressure controlling apparatus 70 according to the first embodiment is applied is explained with reference to FIG. 1. FIG. 1 is a diagram illustrating the configuration of the pressure controlling apparatus 70 and the configuration of the plasma processing apparatus 1 to which the pressure controlling apparatus 70 is applied.

The plasma processing apparatus 1 includes a processing chamber 90, an electrode 10, a plasma generating unit 80, a bias-voltage controlling unit 85, and the pressure controlling apparatus 70.

The processing chamber 90 is a chamber for generating plasma PL inside thereof by a processing gas introduced therein and is formed of a processing container 2. The processing container 2 is, for example, configured to be capable of supplying a processing gas from a gas-supply controlling unit (not shown) to the processing chamber 90 via an air supply pipe formed in the center of an upper portion. Moreover, the processing container 2 is configured to be capable of exhausting a processed processing gas from the processing chamber 90 to the pressure controlling apparatus 70.

The plasma generating unit 80 generates the plasma PL in a space 91 separated from the electrode 10 in the processing chamber 90. Specifically, the plasma generating unit 80 includes a radio-frequency power source 81, a matching box 84, antenna coils 82, and a dielectric wall 83. The radio-frequency power source 81 generates radio-frequency power and supplies it to the antenna coils 82. When impedance is matched between the radio-frequency power source 81 and the antenna coils 82 by the matching box 84, an electromagnetic wave transmits through the dielectric wall 83 functioning also as an upper wall of the processing container 2 and is introduced into the space 91 in the processing chamber 90. In the space 91 in the processing chamber 90, discharge of a processing gas occurs and the plasma PL is generated, so that ions (for example, $F^+$ and $CF_3^+$) are generated together with radicals from the processing gas.

The bias-voltage controlling unit 85 generates a bias voltage to the electrode 10 arranged on the bottom surface side in the processing chamber 90. Specifically, the bias-voltage controlling unit 85 includes a radio-frequency power source 86 and a matching box 87. The radio-frequency power source 86 generates radio-frequency power and, when impedance is matched by the matching box 87, a bias voltage is applied to the electrode 10. The electrode 10 is, for example, formed of metal, such as stainless steel and aluminum, and is insulated from the processing container 2 via an insulation material (not shown). A processing target substrate WF, such as a silicon wafer, is placed on the electrode 10. When a bias voltage is applied, a potential difference is created between the electrode 10 and the plasma PL and ions (for example, $F^+$ and $CF_3^+$) generated in a plasma PL region are drawn into the processing target substrate WF, and anisotropic etching is performed.

The pressure controlling apparatus 70 controls the pressure in the processing chamber 90 by controlling an exhaust amount of a processing gas from the processing chamber 90.

Next, the internal configuration of the pressure controlling apparatus 70 is explained with reference to FIG. 1.

The pressure controlling apparatus 70 includes a pressure sensor (detecting unit) 20, an exhaust pipe 30, a regulating valve 40, a controller (pressure controlling unit for an orifice unit) 42, a controller (pressure controlling unit for a slide valve) 43, and an exhaust system 50.

The pressure sensor 20 detects the pressure in the processing chamber 90 and supplies information on the value of the pressure to the regulating valve 40. The pressure sensor 20, for example, includes a detection space communicating with the processing chamber 90 and a detector element arranged in the detection space. The pressure sensor 20 detects the pressure in the detection space via the detector element as the pressure in the processing chamber 90.

The exhaust pipe 30 communicates with the processing chamber 90. The exhaust pipe 30 is arranged on a central axis CA passing a center 92 of the processing chamber 90. The exhaust pipe 30 includes an exhaust pipe 31 on the upstream side of the regulating valve 40 and an exhaust pipe 32 on the downstream side of the regulating valve 40. The outer wall of the exhaust pipe 30 is, for example, formed of metal such as stainless steel.

The regulating valve 40 is arranged in the exhaust pipe 30, and is connected to the processing chamber 90 via the exhaust pipe 31 on the upstream side and is connected to the exhaust system 50 via the exhaust pipe 32 on the downstream side. The regulating valve 40 is a valve that can regulate the opening degree, and regulates the opening degree so that the pressure in the processing chamber 90 detected by the pressure sensor 20 is set to a target value. Consequently, an exhaust amount of a processing gas from the processing chamber 90 is controlled, so that the pressure in the processing chamber 90 is controlled.

The controller 42 controls driving of an orifice unit 411 of the regulating valve 40 to be described later. The controller 43 controls driving of a pendulum valve 412 of the regulating valve 40 to be described later.

The exhaust system 50 exhausts a processing gas exhausted from the processing chamber 90 via the exhaust pipe 30 and the regulating valve 40. The exhaust system 50 includes a turbo pump 51, an exhaust pipe 52, and a rotary pump 53. The exhaust pipe 52 is maintained in a vacuum state by the rotary pump 53, and the exhaust pipe 32, the exhaust pipe 31, and the processing chamber 90 are maintained in a high vacuum state compared with the exhaust pipe 52 by the turbo pump 51. A processing gas exhausted from the processing chamber 90 is introduced into the exhaust pipe 31 and the exhaust pipe 32 and thereafter, is introduced into the exhaust pipe 52 by the turbo pump 51 to be exhausted by the rotary pump 53.

Figure 2A:
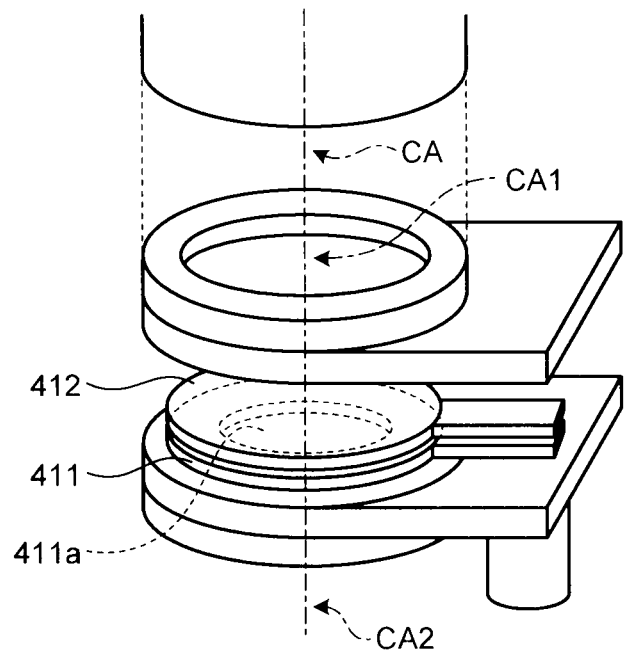
FIG. 2A and FIG. 2B are diagrams illustrating a configuration of a regulating valve in the first embodiment.
Figure 2B:
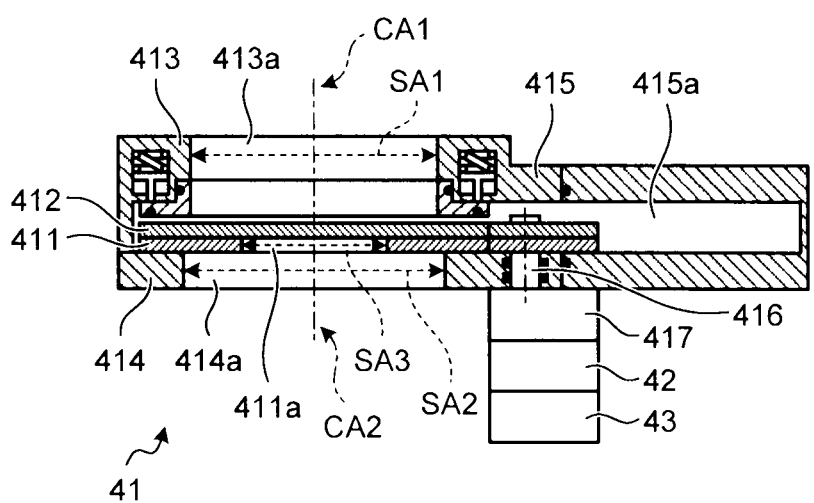

Next, the internal configuration of the regulating valve 40 is explained with reference to FIG. 1 and FIGS. 2A, 2B. FIG. 2A is an exploded perspective view illustrating the configuration of the regulating valve 40 and FIG. 2B is a cross-sectional view illustrating the configuration of the regulating valve 40.

The regulating valve 40 includes a gate valve 41. The gate valve 41 includes an upstream-side outer pipe 413, a downstream-side outer pipe 414, an accommodation space wall 415, an actuator shaft 416, an actuator 417, the orifice unit (changing unit) 411, and the pendulum valve (slide valve) 412.

The upstream-side outer pipe 413 is arranged on the upstream side of the orifice unit 411 and the pendulum valve 412, and forms a space 413a communicating with the exhaust pipe 31 on the upstream side. A central axis CA1 of the space 413a coincides with the central axis CA of the exhaust pipe 31. A cross sectional area SA1 vertical to the central axis CA1 of the space 413a is approximately equal to a flow path cross-sectional area SA of the exhaust pipe 31.

The downstream-side outer pipe 414 is arranged on the downstream side of the orifice unit 411 and the pendulum valve 412 and forms a space 414a communicating with the exhaust pipe 32 on the downstream side. A central axis CA2 of the space 414a coincides with the central axis CA of the exhaust pipe 32. A cross sectional area SA2 vertical to the central axis CA2 of the space 414a is approximately equal to the flow path cross-sectional area SA of the exhaust pipe 32 and is approximately equal to the cross sectional area SA1 vertical to the central axis CA1 of the space 413a.

The accommodation space wall 415 forms an accommodation space 415a for accommodating the orifice unit 411 and the pendulum valve 412 when the orifice unit 411 and the pendulum valve 412 are rotated around the actuator shaft 416. The accommodation space 415a is arranged at a position retracted from the flow path (the space 413a and the space 414a) of the exhaust pipe 30.

The actuator shaft 416 is provided to rotate the orifice unit 411 and the pendulum valve 412. The actuator shaft 416 rotates the orifice unit 411 and the pendulum valve 412 independently from each other. For example, the actuator shaft 416 includes a first fitting portion and a second fitting portion at positions corresponding to the orifice unit 411 and the pendulum valve 412, respectively, in an axis direction and selectively rotates the orifice unit 411 when the first fitting portion is fitted into the orifice unit 411 and selectively rotates the pendulum valve 412 when the second fitting portion is fitted into the pendulum valve 412.

The actuator 417 is controlled by the controller 42 and the controller 43 and rotates the orifice unit 411 and the pendulum valve 412 via the actuator shaft 416. The actuator 417 selectively rotates the orifice unit 411 by fitting the first fitting portion of the actuator shaft 416 into the orifice unit 411 according to control by the controller 42 and selectively rotates the pendulum valve 412 by fitting the second fitting portion of the actuator shaft 416 into the pendulum valve 412 according to control by the controller 43. After rotating the orifice unit 411 and the pendulum valve 412, the actuator 417 moves the orifice unit 411 and the pendulum valve 412 to press them against the upstream-side outer pipe 413 according to control by the controller 42 and the controller 43 thereby ensuring airtightness of the flow path (the space 413a and the space 414a) of the exhaust pipe 30.

The orifice unit 411 is, for example, arranged on the downstream side of the pendulum valve 412 and has a valve port 411a having an area SA3 smaller than the flow path cross-sectional area SA of the exhaust pipe 30. One end of the orifice unit 411 extends to the accommodation space 415a and can fit into the first fitting portion of the actuator 417 in the accommodation space 415a. The orifice unit 411 is configured to be insertable into the flow path of the exhaust pipe 30. In other words, when the first fitting portion is fitted into the orifice unit 411, the controller 42 rotates the orifice unit 411 via the actuator 417 and the actuator shaft 416. In response to this, the orifice unit 411 transitions between a first state of being retracted from the flow path of the exhaust pipe 30 and a second state of being inserted into the flow path of the exhaust pipe 30.

The pendulum valve 412 is arranged on the upstream side of the orifice unit 411. One end of the pendulum valve 412 extends to the accommodation space 415a and can fit into the second fitting portion of the actuator 417 in the accommodation space 415a. When the second fitting portion is fitted into the pendulum valve 412, the controller 43 rotates the pendulum valve 412 via the actuator 417 and the actuator shaft 416. In response to this, the pendulum valve 412 regulates the opening degree of the valve port.

Figure 3A:
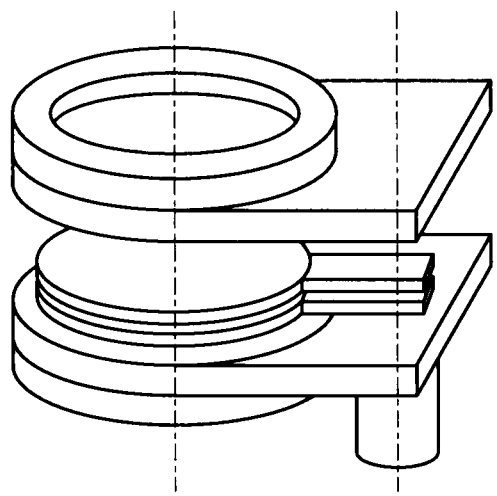
FIG. 3A and FIG. 3B are diagrams illustrating an operation of the regulating valve in the first embodiment.
Figure 3B:
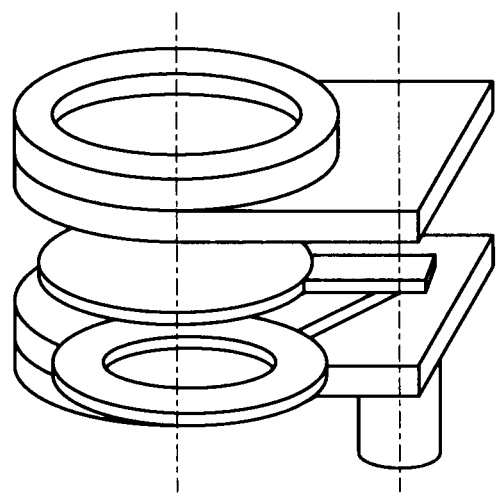

Next, the operation of the regulating valve 40 is explained with reference to FIGS. 3A, 3B and FIGS. 4A to 4E. FIG. 3A and FIG. 3B are exploded perspective views mainly illustrating the operation of the orifice unit 411. FIG. 4A to FIG. 4E are plan views mainly illustrating the operation of the pendulum valve 412.

As shown in FIG. 3A and FIG. 3B, the controller 42 changes the valve port between the first state and the second state.

In the first state, the controller 42 retracts the orifice unit 411 from the flow path of the exhaust pipe 30 on the downstream side of the pendulum valve 412 to set the area of a valve port 411b to the flow path cross-sectional area SA of the exhaust pipe 30. At this time, the center of the valve port 411b is located near the central axis CA of the exhaust pipe 30. Moreover, the controller 43 retracts the pendulum valve 412 from the flow path of the exhaust pipe 30 (see FIG. 4A).

In the second state, the controller 42 inserts the orifice unit 411 into the flow path of the exhaust pipe 30 on the downstream side of the pendulum valve 412 to set the area of the valve port 411a to the area SA3 smaller than the flow path cross-sectional area SA of the exhaust pipe 30. At this time, the center of the valve port 411a is located near the central axis CA of the exhaust pipe 30. Moreover, the controller 43 retracts the pendulum valve 412 from the flow path of the exhaust pipe 30 (see FIG. 4C).

The controller 43 slides the pendulum valve 412 to regulate the opening degree of the valve port.

Figure 4A:
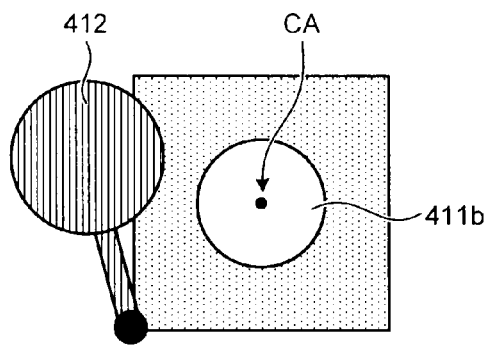
FIG. 4A to FIG. 4E are diagrams illustrating an operation of the regulating valve in the first embodiment.
Figure 4C:
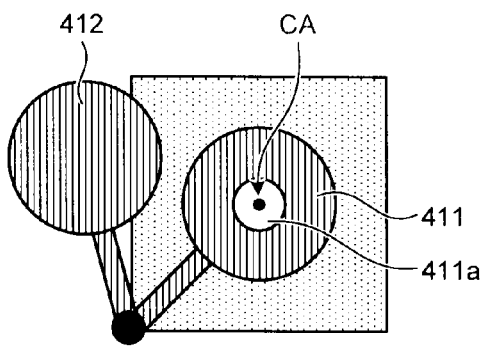
Figure 4B:
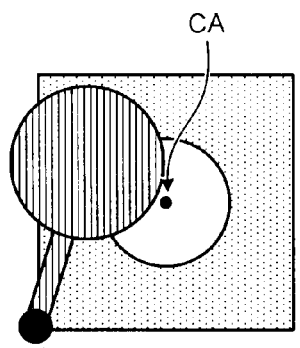

When being changed to the first state, as shown in FIG. 4A and FIG. 4B, the controller 43 slides the pendulum valve 412 to regulate the opening degree of the valve port 411b having the flow path cross-sectional area SA. At this time, as shown in FIG. 4B, the controller 43 performs control by sliding the pendulum valve 412 to a position before a position, at which the pendulum valve 412 intersects with the central axis CA of the exhaust pipe 30, and before a position, at which the opening degree of the valve port 411b becomes approximately equal to the area of the valve port 411a. If the area is controlled to be smaller than this, the state is changed to the second state.

Figure 4D:
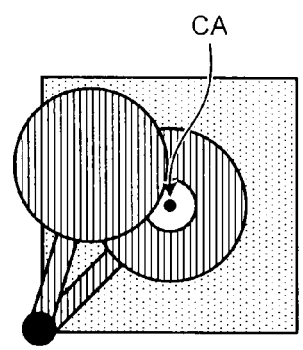
Figure 4E:
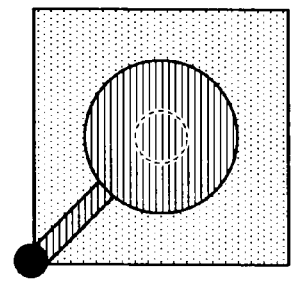

When being changed to the second state, as shown in FIG. 4C to FIG. 4E, the controller 43 slides the pendulum valve 412 to regulate the opening degree of the valve port 411a having the area SA3 smaller than the flow path cross-sectional area SA. At this time, as shown in FIG. 4E, the controller 43 may slide the pendulum valve 412 to a position, at which the pendulum valve 412 intersects with the central axis CA of the exhaust pipe 30, to, for example, cover the whole vale port 411a.

Figure 15:
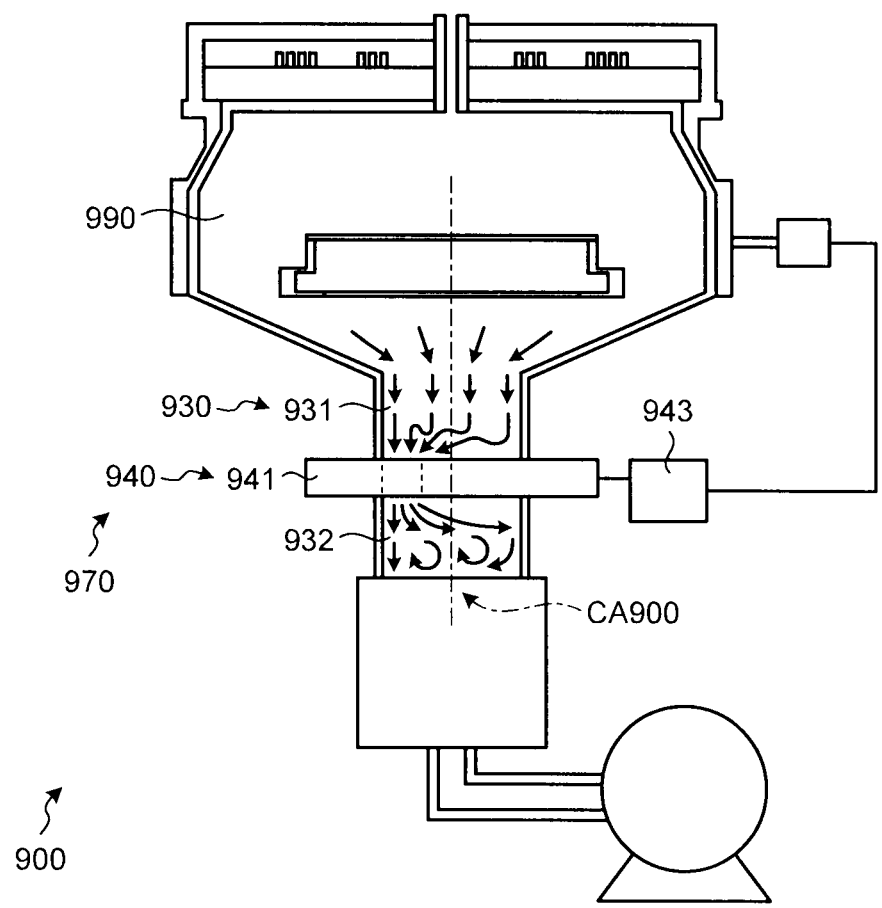
FIG. 15 is a diagram illustrating a configuration of a pressure controlling apparatus according to a comparison example.
Figure 16A:
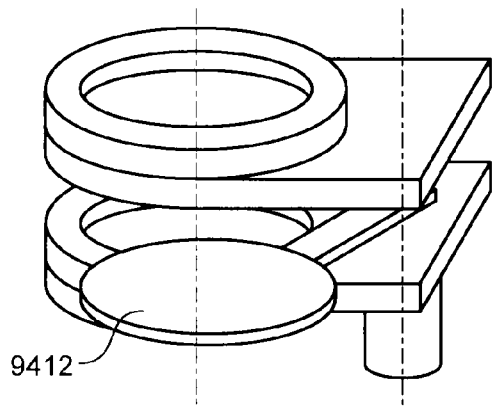
FIG. 16A to FIG. 16E are diagrams illustrating a configuration of a regulating valve in the comparison example.
Figure 16B:
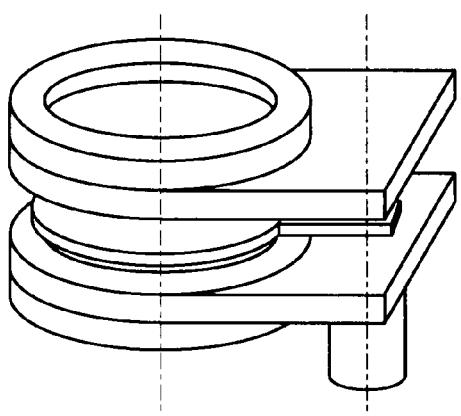
Figure 16C:
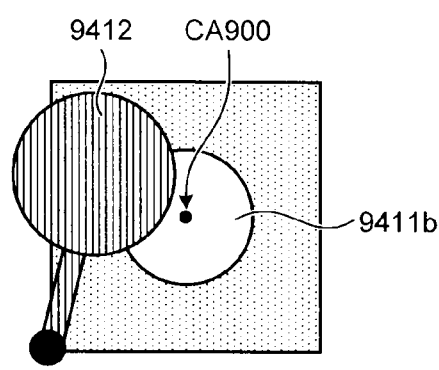
Figure 16D:
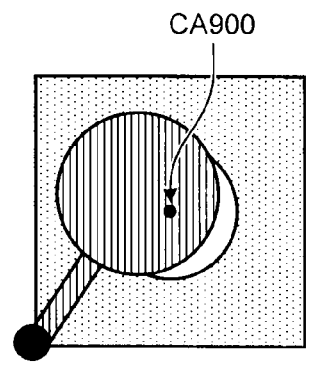

As shown in FIG. 15, a case where a pressure controlling apparatus 970 of a plasma processing apparatus 900 does not include the orifice unit 411 of a regulating valve 940 and the controller 42 (see FIG. 2B) is considered. Specifically, a case where the regulating valve 940 includes the gate valve 41 and a controller 943 and the controller 943 controls driving of a pendulum valve 9412 as shown in FIGS. 16A to 16E is considered. In this case, the controller 943 slides the pendulum valve 9412 to regulate the opening degree of the valve port 411b having the flow path cross-sectional area SA. At this time, as shown in FIG. 16A and FIG. 16C, the controller 943 slides the pendulum valve 9412 to a position, at which the pendulum valve 9412 intersects with a central axis CA900 of an exhaust pipe 930 as shown in FIG. 16D, from a position before a position at which the pendulum valve 9412 intersects with the central axis CA900 of the exhaust pipe 930.

Figure 16E:
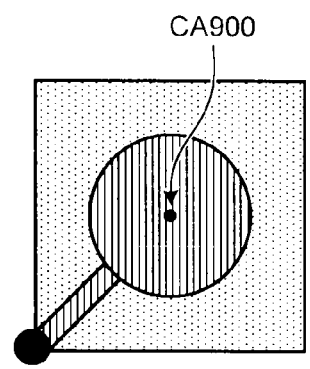

At this time, in each of a high-pressure processing condition in which the pressure in a processing chamber 990 needs to be increased for prioritizing high etch rate and a low-pressure processing condition in which the pressure in the processing chamber 990 needs to be decreased for prioritizing etching accuracy, it is difficult to improve accuracy when controlling the pressure in the processing chamber 990. In other words, in the high-pressure processing condition, as shown in FIG. 16B, FIG. 16D, and FIG. 16E, the pendulum valve 9412 is slid to a position at which the pendulum valve 9412 intersects with the central axis CA900 of the exhaust pipe 930. In this case, the opening area of the valve port changes largely only by slightly moving the pendulum valve 9412, so that an exhaust amount from the processing chamber 990 via an exhaust pipe 931, the regulating valve 940, and an exhaust pipe 932 changes largely, thereby making it difficult to improve accuracy when controlling the pressure in the processing chamber 990 for each processing condition.

On the contrary, in the first embodiment, the regulating valve 40 of the pressure controlling apparatus 70 includes the orifice unit 411 and the controller 42. The controller 42 controls the orifice unit 411 to change the valve port between the valve ports 411b and 411a whose centers are located near the central axis CA of the exhaust pipe 30 and whose area is different from each other. The controller 43 controls the pendulum valve 412 to regulate the opening degree of the valve port changed as above. Specifically, the controller 42 controls the orifice unit 411 to change to the valve port having a small area in the high-pressure processing condition and change to the valve port having a large area in the low-pressure processing condition. The controller 43 controls the pendulum valve 412 to regulate the opening degree of the valve port having a small area in the high-pressure processing condition and regulate the opening degree of the valve port having a large area in the low-pressure processing condition.

At this time, in each of the high-pressure processing condition in which the pressure in the processing chamber 90 needs to be increased for prioritizing high etch rate and the low-pressure processing condition in which the pressure in the processing chamber 90 needs to be decreased for prioritizing etching accuracy, it is easy to improve accuracy when controlling the pressure in the processing chamber 90. In other words, in the high-pressure processing condition, as shown in FIG. 4C to FIG. 4E, even if the pendulum valve 412 is slid to a position at which the pendulum valve 412 intersects with the central axis CA of the exhaust pipe 30 with respect to the valve port 411a having small area and width, an amount of change of an opening area of the valve port can be suppressed small with respect to a sliding displacement of the pendulum valve 412. As a result, an amount of change of an exhaust amount from the processing chamber 90 via the exhaust pipe 31, the regulating valve 40, and the exhaust pipe 32 can be suppressed small, so that accuracy when controlling the pressure in the processing chamber 90 can be improved for each processing condition.

Moreover, in the regulating valve 940 of the pressure controlling apparatus 970 shown in FIG. 15, in the high-pressure processing condition, as shown in FIG. 16D, only a position shifted largely from the central axis CA900 of the exhaust pipe 930 is opened. Therefore, as indicated by arrows in FIG. 15, airflow of a processing gas flowing into the regulating valve 940 from the exhaust pipe 931 is disrupted, and airflow of a processing gas flowing into the exhaust pipe 932 from the regulating valve 940 is also disrupted. Therefore, stabilization time of pressure when controlling the pressure in the processing chamber 990 becomes long, so that etch rate and the like tend to become non-uniform in a plane of the processing target substrate WF (for example, wafer). In other words, it becomes difficult to shorten the stabilization time when controlling the pressure in the processing chamber 990 for each processing condition and perform processing uniformly in a plane of the processing target substrate WF (for example, wafer).

On the contrary, in the first embodiment, the controller 42 changes the valve port between the valve ports 411b and 411a, whose centers are located near the central axis CA of the exhaust pipe 30 and whose area is different from each other, by controlling the orifice unit 411. Then, even in the high-pressure processing condition, as shown in FIG. 4C and FIG. 4D, the state where a portion near the central axis CA of the exhaust pipe 30 is opened is maintained. Consequently, as indicated by arrows in FIG. 1, airflow of a processing gas flowing into the regulating valve 40 from the exhaust pipe 31 is not easily disrupted and airflow of a processing gas flowing into the exhaust pipe 32 from the regulating valve 40 is not also easily disrupted. Therefore, stabilization time of pressure when controlling the pressure in the processing chamber 90 can be shortened and etch rate and the like can be made uniform in a plane of the processing target substrate WF (for example, wafer). In other words, the stabilization time when controlling the pressure in the processing chamber 90 is easily shortened for each processing condition and processing is easily performed uniformly in a plane of the processing target substrate WF (for example, wafer).

Moreover, in the first embodiment, the orifice unit 411 has the valve port 411a having an area smaller than the flow path cross-sectional area of the exhaust pipe at a position to be near the central axis CA of the exhaust pipe 30. Then, the controller 42 changes the valve port between the first state in which the orifice unit 411 is retracted from the flow path of the exhaust pipe 30 on the downstream side of the pendulum valve 412 to set the area of the valve port 411b to the flow path cross-sectional area of the exhaust pipe 30 and the second state in which the orifice unit 411 is inserted into the flow path of the exhaust pipe 30 on the downstream side of the pendulum valve 412 to set the area of the valve port 411a to an area smaller than the flow path cross-sectional area of the exhaust pipe 30. Consequently, the valve port can be changed between the valve ports 411b and 411a whose centers are located near the central axis CA of the exhaust pipe 30 and whose area is different from each other.

First Modified Example

Figure 5A:
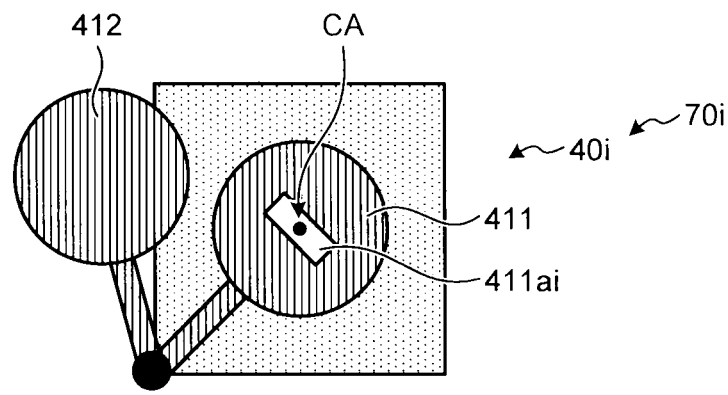
FIG. 5A to FIG. 5C are diagrams illustrating an operation of a regulating valve in a first modified example of the first embodiment.
Figure 5B:
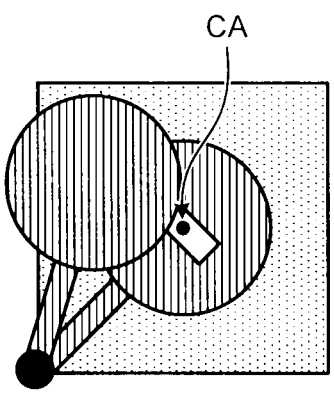
Figure 5C:
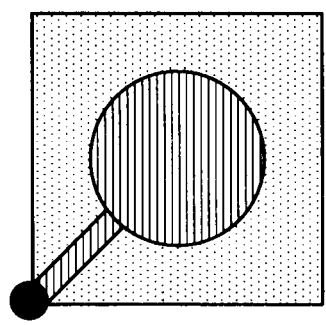

As shown in FIGS. 5A to 5C, in a regulating valve 40i of a pressure controlling apparatus 70i of a plasma processing apparatus 1i, a plurality of valve ports to be changed by controlling the orifice unit 411 by the controller 42 may include a rectangular valve port 411ai. Specifically, the orifice unit 411 has the rectangular valve port 411ai having a longitudinal direction in a direction in which the pendulum valve 412 slides. Then, the controller 42 changes the valve port to the valve port 411ai having a small area in the high-pressure processing condition and to the valve port 411b (see FIG. 4A) having large area in the low-pressure processing condition by controlling the orifice unit 411. The controller 43 regulates the opening degree of the valve port 411ai having a small area in the high-pressure processing condition and regulates the opening degree of the valve port 411b having a large area in the low-pressure processing condition by controlling the pendulum valve 412.

At this time, in each of the high-pressure processing condition in which the pressure in the processing chamber 90 needs to be increased for prioritizing high etch rate and the low-pressure processing condition in which the pressure in the processing chamber 90 needs to be decreased for prioritizing etching accuracy, it is easy to improve accuracy when controlling the pressure in the processing chamber 90. In other words, in the high-pressure processing condition, as shown in FIG. 5A to FIG. 5C, the pendulum valve 412 is slid to a position at which the pendulum valve 412 intersects with the central axis CA of the exhaust pipe 30 with respect to the valve port 411ai having a uniform width in a sliding direction of the pendulum valve 412, so that it is possible to make an amount of change of an opening area of the valve port with respect to a sliding displacement of the pendulum valve 412 uniform. As a result, an amount of change of an exhaust amount from the processing chamber 90 via the exhaust pipe 31, the regulating valve 40, and the exhaust pipe 32 can be made uniform, so that accuracy when controlling the pressure in the processing chamber 90 can be further improved for each processing condition.

Second Embodiment

Figure 6A:
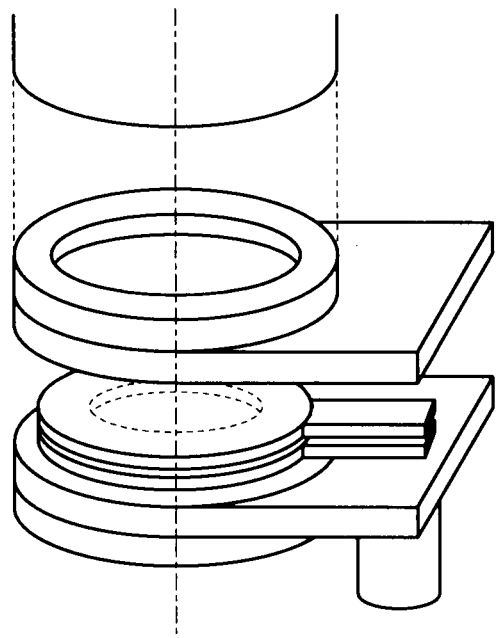
FIG. 6A and FIG. 6B are diagrams illustrating an operation of a regulating valve in a second modified example of the first embodiment.
Figure 6B:
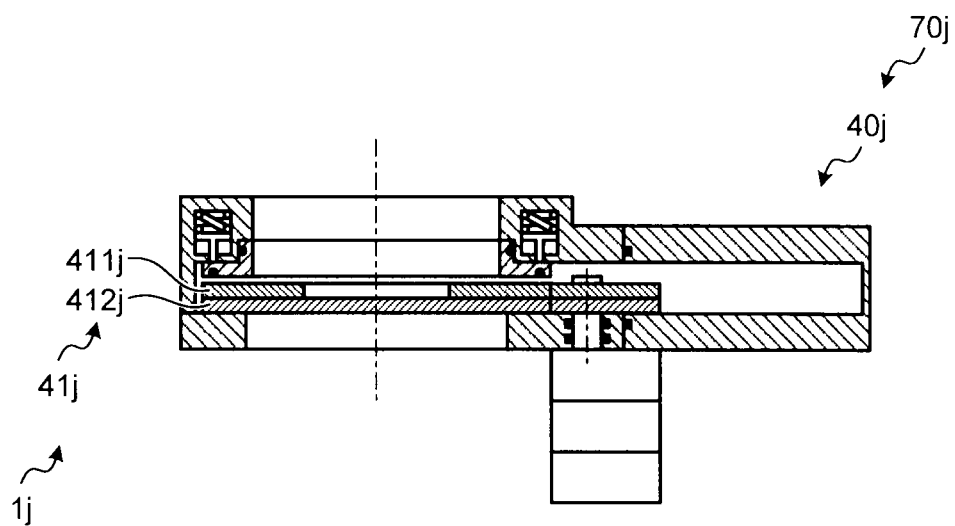

As shown in FIG. 6A and FIG. 6B, in a regulating valve 40j of a pressure controlling apparatus 70j of a plasma processing apparatus 1j, an orifice unit 411j in a gate valve 41j may be provided on the upstream side of a pendulum valve 412j. In this case, the controller 42 changes the valve port between the first state in which the orifice unit 411j is retracted from the flow path of the exhaust pipe 30 on the upstream side of the pendulum valve 412j to set the area of the valve port 411b to the flow path cross-sectional area of the exhaust pipe 30 and the second state in which the orifice unit 411j is inserted into the flow path of the exhaust pipe 30 on the upstream side of the pendulum valve 412j to set the area of the valve port 411a to an area smaller than the flow path cross-sectional area of the exhaust pipe 30. Consequently, the valve port can be changed between the valve ports 411b and 411a whose centers are located near the central axis CA of the exhaust pipe 30 and whose area is different from each other.

Third Modified Example

Figure 7A:
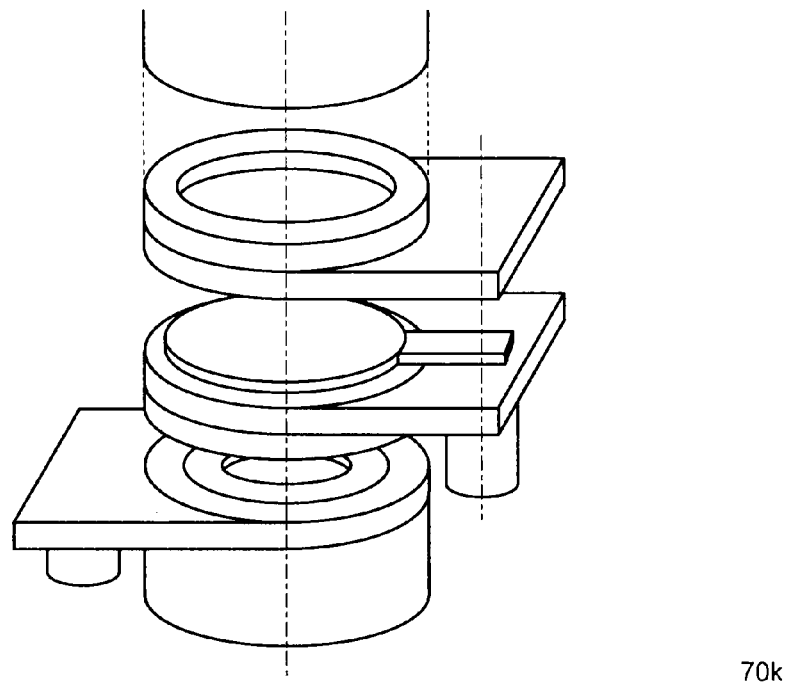
FIG. 7A to FIG. 7C are diagrams illustrating an operation of a regulating valve in a third modified example of the first embodiment.
Figure 7B:
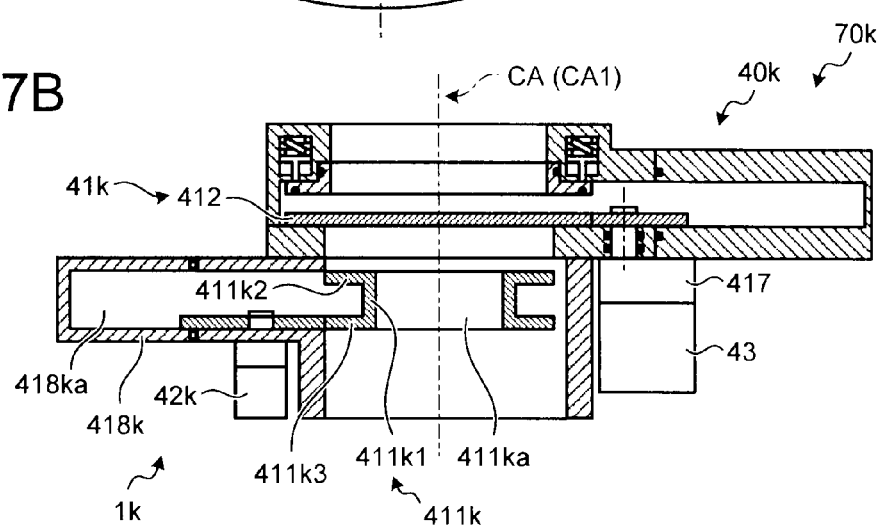
Figure 7C:
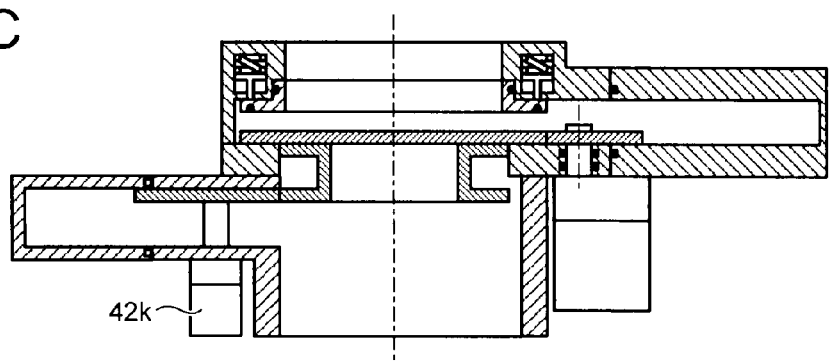

As shown in FIGS. 7A to 7C, in a regulating valve 40k of a pressure controlling apparatus 70k of a plasma processing apparatus 1k, an orifice unit 411k may be arranged at a position spaced from the pendulum valve 412 and may approach a position near the pendulum valve 412 when being inserted into the flow path. Specifically, a gate valve 41k does not include an orifice unit and the orifice unit 411k is configured as a separate member from the gate valve 41k. In the first state, a controller 42k retracts the orifice unit 411k from the flow path of the exhaust pipe 30 into an accommodation space 418ka at a position spaced from the pendulum valve 412. The accommodation space 418ka is a space formed by an accommodation space wall 418k. Then, as shown in FIG. 7A and FIG. 7B, when transitioning from the first state to the second state, the controller 42 inserts the orifice unit 411k into the flow path of the exhaust pipe 30 at a position spaced from the pendulum valve 412 and moves the orifice unit 411k to approach the pendulum valve 412 along the flow path of the exhaust pipe 30. Moreover, in the second state, the controller 42k sets the orifice unit 411k to a state to be close to the downstream side of the pendulum valve 412. In this manner, because the orifice unit 411k is configured as a separate member from the gate valve 41k including the pendulum valve 412 and the like, the orifice unit 411k can be configured regardless of the specifications of the gate valve 41k, so that design freedom of the orifice unit 411k can be improved.

Moreover, in the regulating valve 40k, the orifice unit 411k may be configured to have an approximately laterally U-shaped cross section as shown in FIG. 7B and FIG. 7C. Specifically, the orifice unit 411k includes a tubular member 411k1, a first hollow plate 411k2, and a second hollow plate 411k3. The tubular member 411k1 defines a valve port 411ka. The tubular member 411k1, for example, has a cylindrical shape. The first hollow plate 411k2 extends outwardly from the end portion of the tubular member 411k1 on the upstream side. The second hollow plate 411k3 extends outwardly from the end portion of the tubular member 411k1 on the downstream side.

As above, in order to make the orifice unit 411k close to a position near the pendulum valve 412 from a position spaced from the pendulum valve 412, the orifice unit 411k needs to have a thickness in a direction along the central axis CA of the exhaust pipe 30. In this case also, because the orifice unit 411k is configured to have an approximately laterally U-shaped cross section, the orifice unit 411k can be reduced in weight.

The orifice unit 411k may be configured to approach the pendulum valve 412 from the upstream side. For example, the arrangement relationship between the orifice unit 411k and the pendulum valve 412 in FIG. 7A to FIG. 7C may be switched and the configuration of the orifice unit 411k may be inverted. In this case, the tubular member 411k1, for example, has a cylindrical shape in the similar manner to the above, however, the first hollow plate 411k2 extends outwardly from the end portion of the tubular member 411k1 on the downstream side and the second hollow plate 411k3 extends outwardly from the end portion of the tubular member 411k1 on the upstream side.

Fourth Modified Example

Figure 8A:
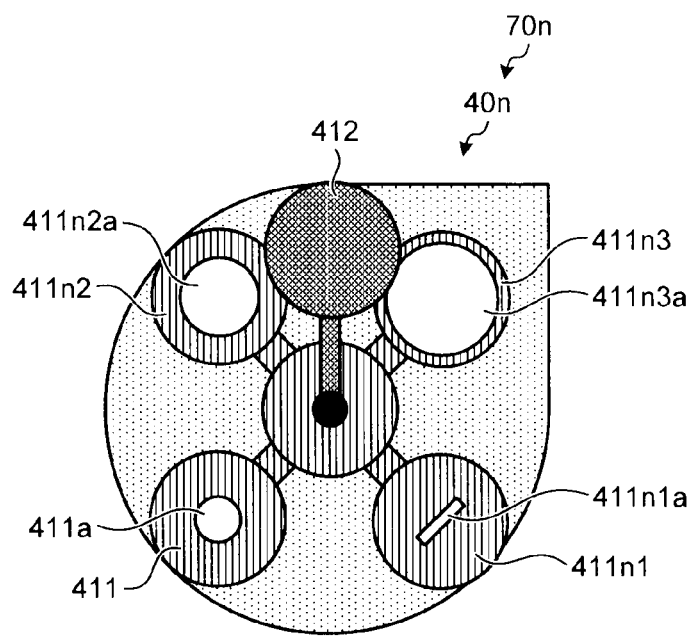
FIG. 8A to FIG. 8C are diagrams illustrating an operation of a regulating valve in a fourth modified example of the first embodiment.
Figure 8B:
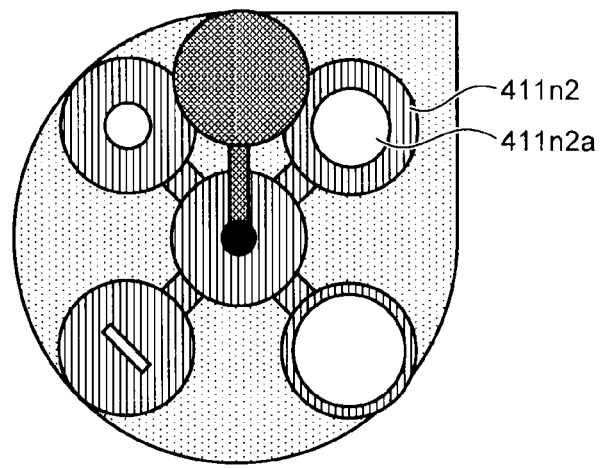
Figure 8C:
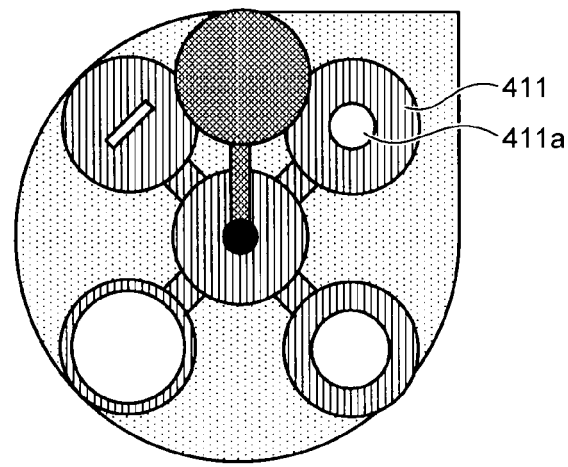

As shown in FIG. 8A to FIG. 8C, in a regulating valve 40n of a pressure controlling apparatus 70n of the plasma processing apparatus 1, a plurality of orifice units 411, 411n1, 411n2, and 411n3, which can be inserted into the flow path of the exhaust pipe 30, may be provided. The orifice unit 411n1 has a valve port 411n1a having an area smaller than the orifice unit 411 in the similar manner to the first embodiment. In the similar manner to the first modified example, the orifice unit 411n1 may have a rectangular valve port 411n1a having a longitudinal direction in a direction in which the pendulum valve 412 slides. The orifice unit 411n2 has a valve port 411n2a having an area larger than the orifice unit 411. The orifice unit 411n3 has a valve port 411n3a having an area larger than the orifice units 411 and 411n2. The area of the valve port 411n3a may be, for example, the same as the flow path cross-sectional area of the exhaust pipe 30.

Moreover, any of the orifice units 411, 411n1, 411n2, and 411n3 may be selectively insertable into the flow path of the exhaust pipe 30 like a revolver. For example, FIG. 8A illustrates a state where the orifice unit 411n3 is inserted into the flow path of the exhaust pipe 30, FIG. 8B illustrates a state where the orifice unit 411n2 is inserted into the flow path of the exhaust pipe 30, and FIG. 8C illustrates a state where the orifice unit 411 is inserted into the flow path of the exhaust pipe 30. Although not shown, the orifice unit 411n1 can also be inserted into the flow path of the exhaust pipe 30.

In this manner, the valve port can be changed in multiple stages between the valve ports 411n1a, 411a, 411n2a, and 411n3a whose centers are located near the central axis CA of the exhaust pipe 30 and whose area is different from each other.

Second Embodiment

Figure 9:
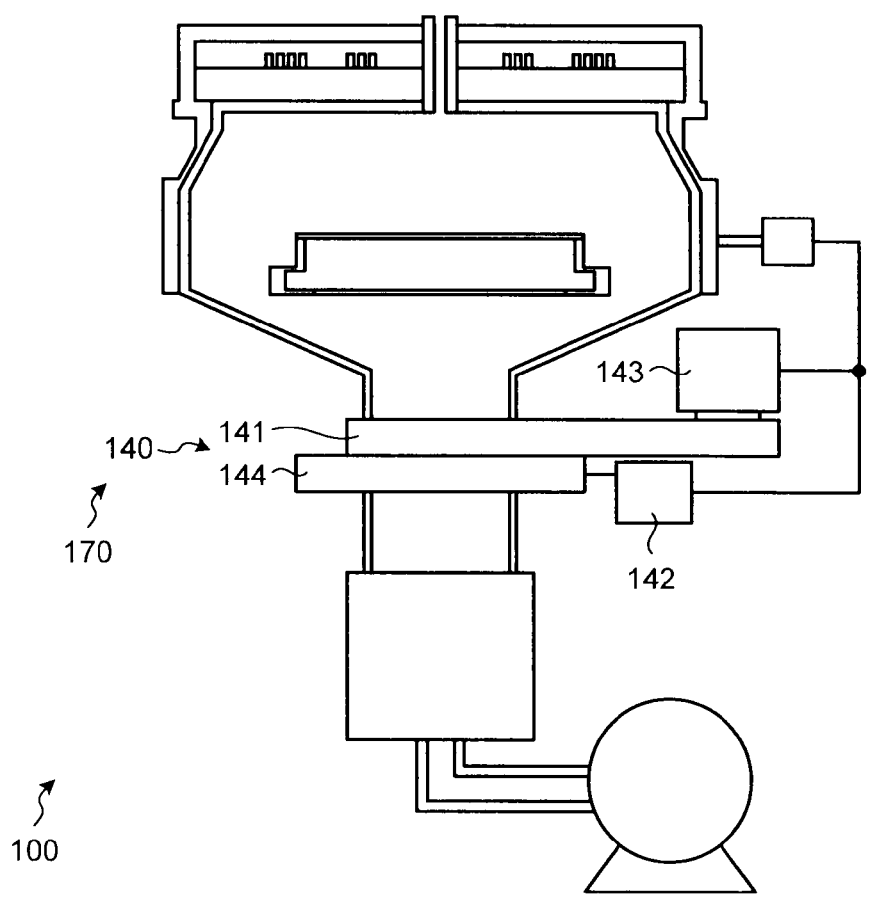
FIG. 9 is a diagram illustrating a configuration of a pressure controlling apparatus according to a second embodiment.

Next, a pressure controlling apparatus 170 according to the second embodiment is explained with reference to FIG. 9 to FIGS. 12A to 12D. FIG. 9 is a diagram illustrating the configuration of the pressure controlling apparatus 170 and the configuration of a plasma processing apparatus to which the pressure controlling apparatus 170 is applied. FIGS. 10A, 10B are diagrams illustrating a configuration of a regulating valve 140. FIGS. 11A to 11C and FIGS. 12A to 12D are diagrams illustrating a configuration of a throttle mechanism 144. In the followings, portions different from the first embodiment are mainly explained.

In the regulating valve 140 of the pressure controlling apparatus 170 of a plasma processing apparatus 100, a gate valve 141 does not include an orifice unit and the throttle mechanism 144 changes the valve port instead of an orifice unit. In other words, as shown in FIG. 10A, the throttle mechanism 144 is, for example, arranged on the downstream side of the pendulum valve 412. As shown in FIGS. 10A and 10B, a controller 142 controls the throttle mechanism 144 to change the area of the valve port continuously from the flow path cross-sectional area of the exhaust pipe 30 to an area smaller than the flow path cross-sectional area of the exhaust pipe 30. Then, the pendulum valve 412 and a controller 143 regulate the opening degree of the valve port changed by the throttle mechanism 144 and the controller 142.

Figure 11A:
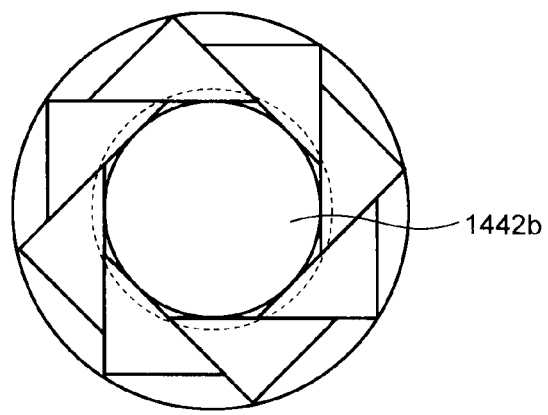
FIG. 11A to FIG. 11C are diagrams illustrating an operation of a throttle mechanism in the second embodiment.
Figure 11B:
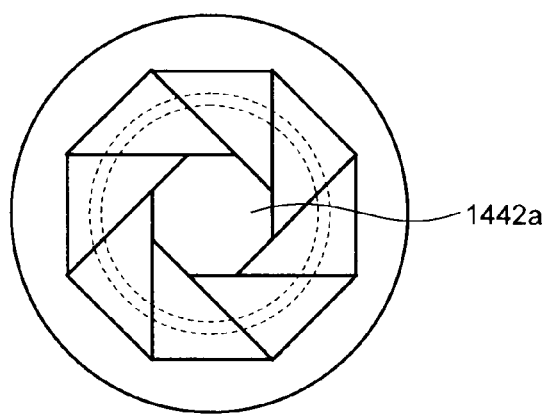
Figure 11C:
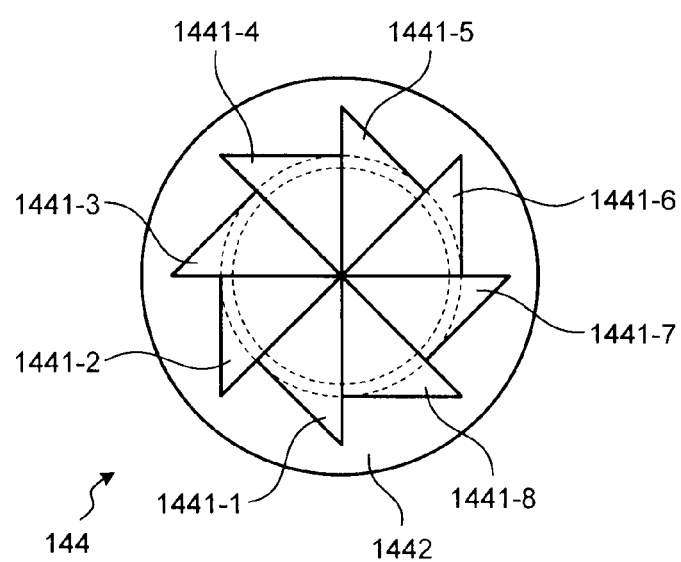

Specifically, as shown in FIGS. 11A to 11C, the throttle mechanism 144 includes a plurality of blades 1441-1 to 1441-8 and a doughnut-shaped member 1442. The doughnut-shaped member 1442, for example, has an opening having an area similar to the flow path cross-sectional area SA of the exhaust pipe 30. The controller 142 controls such that the blades 1441-1 to 1441-8 gradually close the opening of the doughnut-shaped member 1442 as shown in FIGS. 11B and 11C from a state where the blades 1441-1 to 1441-8 are controlled to entirely open the opening of the doughnut-shaped member 1442 to be a valve port 1442b having the flow path cross-sectional area SA of the exhaust pipe 30. Consequently, the area of the valve port is changed continuously from the flow path cross-sectional area 1442b of the exhaust pipe 30 to, for example, an area 1442a smaller than the flow path cross-sectional area of the exhaust pipe 30.

Figure 12A:
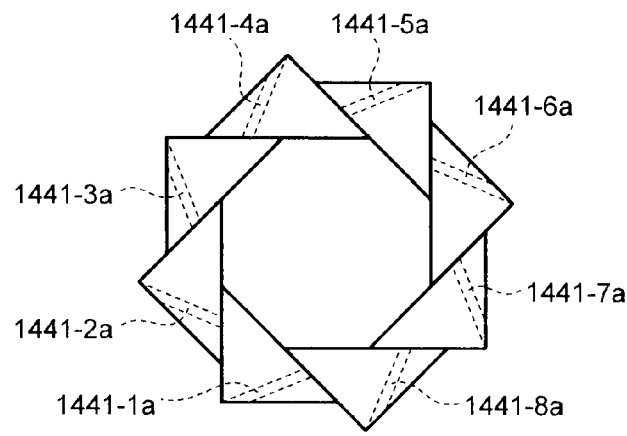
FIG. 12A to FIG. 12D are diagrams illustrating an operation of the throttle mechanism in the second embodiment.
Figure 12B:
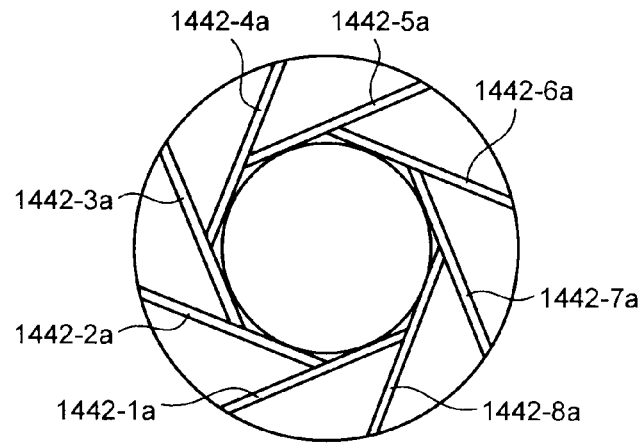
Figure 12C:
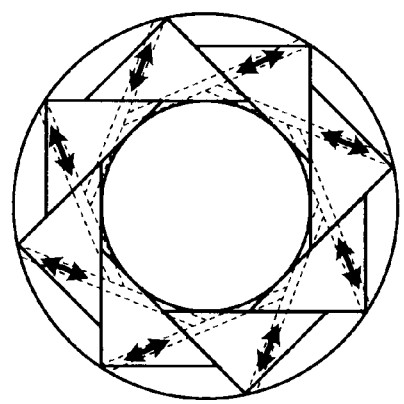
Figure 12D:
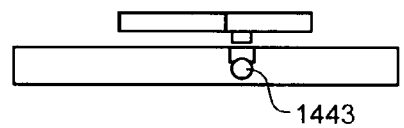

More specifically, in the throttle mechanism 144, as shown in FIG. 12A, the blades 1441-1 to 1441-8 include projections 1441-1a to 1441-8a, respectively, on the back surface side, and as shown in FIG. 12B, the doughnut-shaped member 1442 includes rails 1442-1a to 1442-8a corresponding to the projections 1441-1a to 1441-8a, respectively, on the front surface side. In other words, the controller 142 causes the projections 1441-1a to 1441-8a of the blades 1441-1 to 1441-8 to travel on the rails 1442-1a to 1442-8a of the doughnut-shaped member 1442 as shown in FIG. 12C, for example, by rotating the doughnut-shaped member 1442 via an actuator (not shown). For example, as shown in FIG. 12C, when the doughnut-shaped member 1442 is rotated clockwise, each of the blades 1441-1 to 1441-8 travels in a direction toward the opening of the doughnut-shaped member 1442. Consequently, the blades 1441-1 to 1441-8 gradually open the opening of the doughnut-shaped member 1442. At this time, as shown in FIG. 12D, if ball bearings 1443 are provided on the rails 1442-1a to 1442-8a, the blades 1441-1 to 1441-8 can travel smoothly.

As above, in the second embodiment, the controller 42 controls the throttle mechanism 144 to change the area of the valve port continuously from the flow path cross-sectional area of the exhaust pipe 30 to an area smaller than the flow path cross-sectional area of the exhaust pipe 30. Consequently, the valve port can be changed in further multiple stages between a plurality of valve ports whose centers are located near the central axis CA of the exhaust pipe 30 and whose area is different from each other.

The throttle mechanism 144 in the second embodiment may be applied to the configuration in the first embodiment instead of the pendulum valve 412 in the first embodiment.

Third Embodiment

Figure 13:
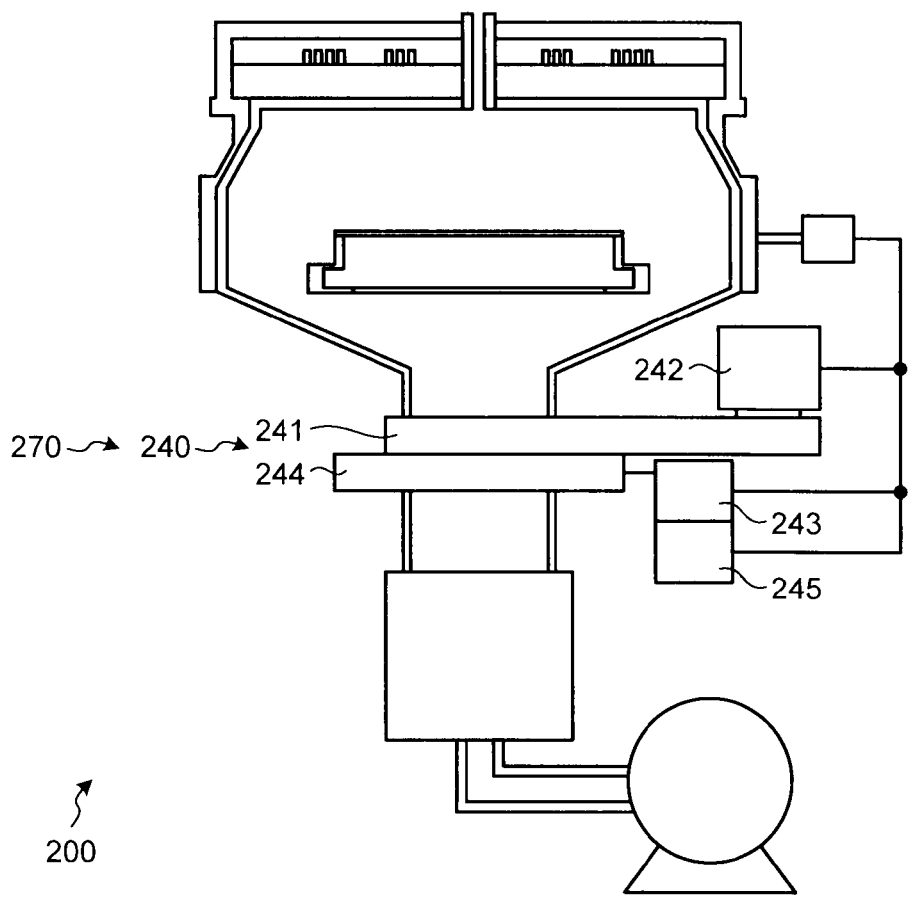
FIG. 13 is a diagram illustrating a configuration of a pressure controlling apparatus according to a third embodiment.
Figure 14B:
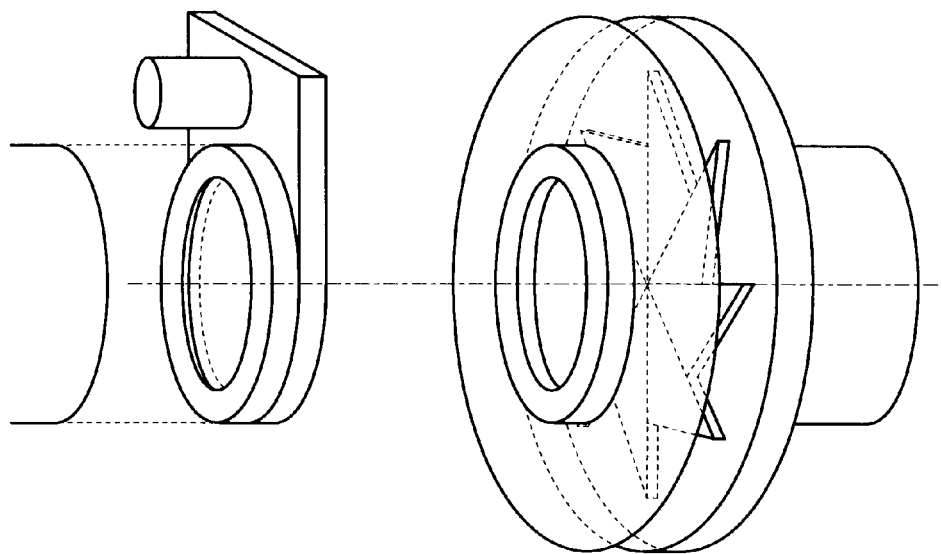
FIG. 14A and FIG. 14B are diagrams illustrating an operation of a regulating valve in the third embodiment.
Figure 14A:
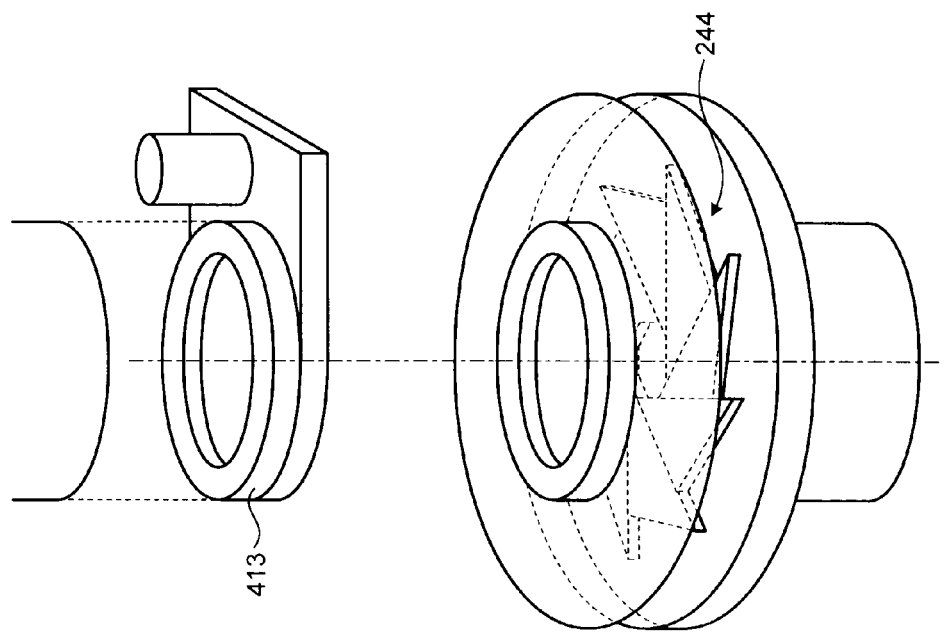

Next, a pressure controlling apparatus 270 according to the third embodiment is explained with reference to FIG. 13 and FIGS. 14A, 14B. FIG. 13 is a diagram illustrating the configuration of the pressure controlling apparatus 270 and the configuration of a plasma processing apparatus 200 to which the pressure controlling apparatus 270 is applied. FIGS. 14A, 14B are diagrams illustrating a configuration of a regulating valve 240. In the followings, portions different from the first embodiment are mainly explained.

In the regulating valve 240 of the pressure controlling apparatus 270 of the plasma processing apparatus 200, a gate valve 241 includes a shutter 413 that performs only opening and closing instead of a pendulum valve, and a throttle mechanism 244 regulates the opening degree of the valve port instead of a pendulum valve. In other words, the throttle mechanism 244 includes a coarse-adjustment mechanism (not shown) and a fine-adjustment mechanism (not shown) and is, for example, as shown in FIG. 14A, arranged on the downstream side of the shutter 413. When controlling pressure, as shown in FIG. 14A, a controller 242 sets the shutter 413 to be fully opened, and controllers 243 and 245 regulate the opening degree of the changed valve port by controlling the throttle mechanism 244 while maintaining a state where the center of the valve port is at a position near the central axis CA of the exhaust pipe 30. The controller 243 coarsely regulates the opening degree of the throttle mechanism 244 via the coarse-adjustment mechanism and the controller 245 finely regulates the opening degree of the throttle mechanism 244 via the fine-adjustment mechanism.

When isolating the processing chamber 90 from the exhaust side of the exhaust pipe 32, the controller 243 sets the throttle mechanism 244 to the narrowest state, however, if airtightness of the throttle mechanism is low, the processing chamber 90 may not be isolated. In such a case, as shown in FIG. 14B, the controller 242 sets the shutter 413 to be fully closed. Because airtightness can be easily ensured by the shutter 413, the processing chamber 90 can be set to an isolated state.

In this manner, in the third embodiment, because the opening degree of the valve port is regulated while maintaining a state where the center of the valve port is at a position near the central axis of the exhaust pipe 30, airflow of a processing gas when regulating the opening degree of the valve port is further prevented from being disrupted easily. Consequently, stabilization time of pressure when controlling the pressure in the processing chamber 90 can be further shortened and the opening degree of the valve port can be changed further continuously and accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pressure controlling apparatus that controls pressure of a processing gas in a processing chamber of a plasma processing apparatus that generates plasma from a processing gas introduced into the processing chamber and processes a processing target substrate, the pressure controlling apparatus comprising:
    a pressure sensor configured to detect pressure of a processing gas in the processing chamber;
    an exhaust pipe that is communicated with the processing chamber and has a central axis passing a center of the processing chamber;
    a regulating valve arranged in the exhaust pipe; and
    a pressure controller configured to control the regulating valve so that pressure detected by the pressure sensor matches a target value, wherein
    the regulating valve includes
        a valve port communicated with the exhaust pipe,
        a changing mechanism configured to change a shape of the valve port to a different shape whose center is located near the central axis of the exhaust pipe, and
        a slide valve that regulates an opening degree of the valve port changed by the changing mechanism, and
    the pressure controller controls changing of a shape of the valve port by the changing mechanism and regulation of an opening degree of the valve port by the slide valve,
    and wherein the changing mechanism includes an orifice unit that has an opening having an area smaller than the valve port and, by inserting the orifice unit into the valve port, changes an area of the valve port to an area smaller than an area before inserting the orifice unit,
    the orifice unit is inserted into a position spaced from the slide valve and is moved to approach the slide valve along a flow path of the valve port, and the orifice unit includes
- a tubular member that defines the valve port,
- a first hollow plate that extends outwardly from an end portion of the tubular member on the slide valve side, and
- a second hollow plate that extends outwardly from an end portion of the tubular member on an opposite side of the slide valve.

2. The pressure controlling apparatus according to claim 1, wherein the slide valve is located on an upstream side of the orifice unit in a flow path of the valve port.

3. The pressure controlling apparatus according to claim 1, wherein the slide valve is located on a downstream side of the orifice unit in a flow path of the valve port.

4. The pressure controlling apparatus according to claim 1, wherein
the orifice unit and the slide valve have a common rotation shaft, and
the pressure controller rotates the orifice unit and the slide valve independently from each other.

5. The pressure controlling apparatus according to claim 1, wherein the changing mechanism includes a plurality of orifice units whose opening shape and/or opening area is different from each other.

6. The pressure controlling apparatus according to claim 1, wherein an opening shape of the orifice unit is a rectangular shape having a longitudinal direction in a direction in which the slide valve slides.

7. The pressure controlling apparatus according to claim 4, wherein the slide valve is a pendulum valve.

8. The pressure controlling apparatus according to claim 5, wherein the changing mechanism selectively inserts any of the orifice units into the valve port.

9. The pressure controlling apparatus according to claim 1, wherein
the slide valve is located on an upstream side of the orifice unit in a flow path of the valve port, and
the second hollow plate is supported by a rotation shaft and is moved to approach the slide valve via the rotation shaft.

10. The pressure controlling apparatus according to claim 1, wherein
the slide valve is located on a downstream side of the orifice unit in a flow path of the valve port, and
the first hollow plate is supported by a rotation shaft and is moved to approach the slide valve via the rotation shaft.

11. The pressure controlling apparatus according to claim 1, wherein the orifice unit includes an accommodation space wall that forms an accommodation space accommodating the first hollow plate, the tubular member, and the second hollow plate.

12. The pressure controlling apparatus according to claim 11, wherein the accommodation space formed by the accommodation space wall is arranged adjacent to the exhaust pipe and is communicated with the exhaust pipe at a position spaced from the slide valve.

13. A pressure controlling apparatus that controls pressure of a processing gas in a processing chamber of a plasma processing apparatus that generates plasma from a processing gas introduced into the processing chamber and processes a processing target substrate, the pressure controlling apparatus comprising:
- a pressure sensor configured to detect pressure of a processing gas in the processing chamber;
- an exhaust pipe that is communicated with the processing chamber and has a central axis passing a center of the processing chamber;
- a regulating valve arranged in the exhaust pipe; and
- a pressure controller configured to control the regulating valve so that pressure detected by the pressure sensor matches a target value, wherein the regulating valve includes
- a valve port communicated with the exhaust pipe,
- a changing mechanism configured to change a shape of the valve port to a different shape whose center is located near the central axis of the exhaust pipe, and
- a throttle mechanism that continuously changes an opening degree of the valve port changed by the changing mechanism so as to close from a periphery toward a center of the valve port along a plane substantially perpendicular to the central axis of the exhaust pipe with maintaining a state that the valve port is free from obstacles, and the pressure controller controls changing of a shape of the valve port by the changing mechanism and continuously changing of an opening degree of the valve port by the throttle mechanism;

wherein the throttle mechanism includes:
- a doughnut-shaped member that has an opening corresponding to the valve port and a plurality of rails extending away from the opening,
- a plurality of blades travelling along the rails, and
- a plurality of ball bearings provided on the rails.

14. The pressure controlling apparatus according to claim 13, wherein the throttle mechanism includes a controller that causes the blades to travel along the rails by rotating the doughnut-shaped member.

15. The pressure controlling apparatus according to claim 14, wherein the controller causes the blades to travel in a direction toward the opening by rotating the doughnut-shaped member clockwise.

* * * * *